United States Patent
Lee

(10) Patent No.: US 8,258,023 B2
(45) Date of Patent: Sep. 4, 2012

(54) THIN FILM TRANSISTOR AND METHOD FOR PREPARING THE SAME

(75) Inventor: Jung-Hyoung Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 292 days.

(21) Appl. No.: 12/451,051

(22) PCT Filed: Apr. 25, 2008

(86) PCT No.: PCT/KR2008/002376
§ 371 (c)(1),
(2), (4) Date: Oct. 23, 2009

(87) PCT Pub. No.: WO2008/133456
PCT Pub. Date: Nov. 6, 2008

(65) Prior Publication Data
US 2010/0090215 A1    Apr. 15, 2010

(30) Foreign Application Priority Data

Apr. 25, 2007 (KR) .................. 10-2007-0040328

(51) Int. Cl.
*H01L 21/00* (2006.01)
(52) U.S. Cl. ... 438/158; 438/104; 257/43; 257/E29.294; 257/E29.273
(58) Field of Classification Search .......... 257/43, 257/E21.411, E29.294, E29.273; 438/104, 438/151, 158
See application file for complete search history.

(56) References Cited

U.S. PATENT DOCUMENTS

| | | | |
|---|---|---|---|
| 6,468,822 B2 | 10/2002 | Maeda et al. | |
| 6,885,064 B2 | 4/2005 | You | |
| 7,374,984 B2 * | 5/2008 | Hoffman et al. | 438/164 |
| 7,511,343 B2 * | 3/2009 | Li et al. | 257/347 |
| 7,982,274 B2 * | 7/2011 | Afzali-Ardakani et al. | 257/391 |
| 2004/0175860 A1 | 9/2004 | Park et al. | |
| 2006/0060857 A1 * | 3/2006 | Mardilovich et al. | 257/66 |
| 2006/0278606 A1 | 12/2006 | Park et al. | |
| 2007/0069209 A1 | 3/2007 | Jeong et al. | |
| 2007/0075365 A1 * | 4/2007 | Mardilovich et al. | 257/347 |

FOREIGN PATENT DOCUMENTS

KR  10-2004-0079516 A   9/2004
KR  10-2007-0035373     3/2007

OTHER PUBLICATIONS

Chang Jung Kim el. al., "Highly Stable Ga2O3-In2O3-ZnO TFT for Active-Matrix Organic Light-Emitting Diode Display Application," 2006 IEEE, IEDM '06, International, Dec. 11-13, 2006, pp. 1-4.
Yutaka Ohya et. al., "Thin Film Transistor of ZnO Fabricated by Chemical Solution Deposition," Jpn. J. Appl. Phys, Sep. 27, 2000, pp. 297-298.

* cited by examiner

*Primary Examiner* — David Vu
(74) *Attorney, Agent, or Firm* — McKenna Long & Aldridge LLP

(57) ABSTRACT

The present invention relates to a thin film transistor and a method of manufacturing the same. More particularly, the present invention relates to a thin film transistor that includes a zinc oxide material including Si as a channel material of a semiconductor layer, and a method of manufacturing the same.

15 Claims, 3 Drawing Sheets

[Fig. 1]
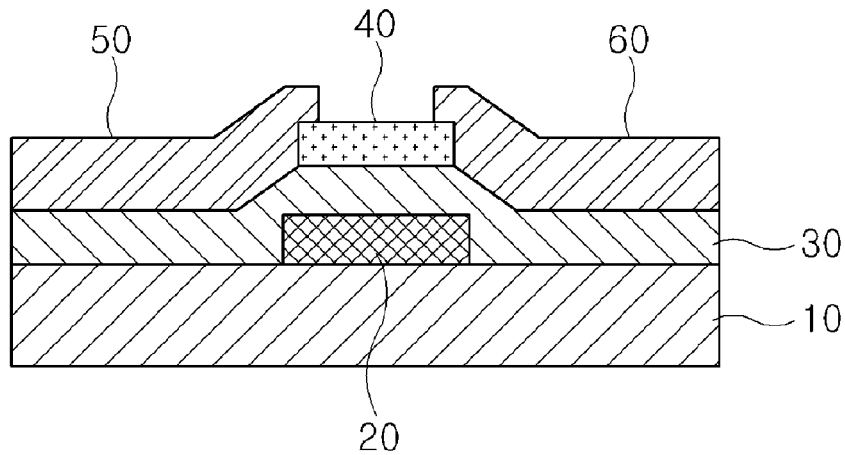
[Fig. 2]
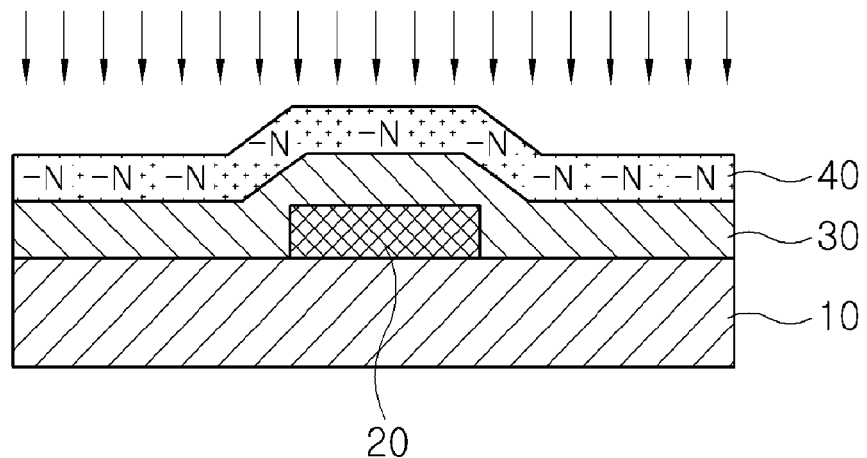
[Fig. 3]
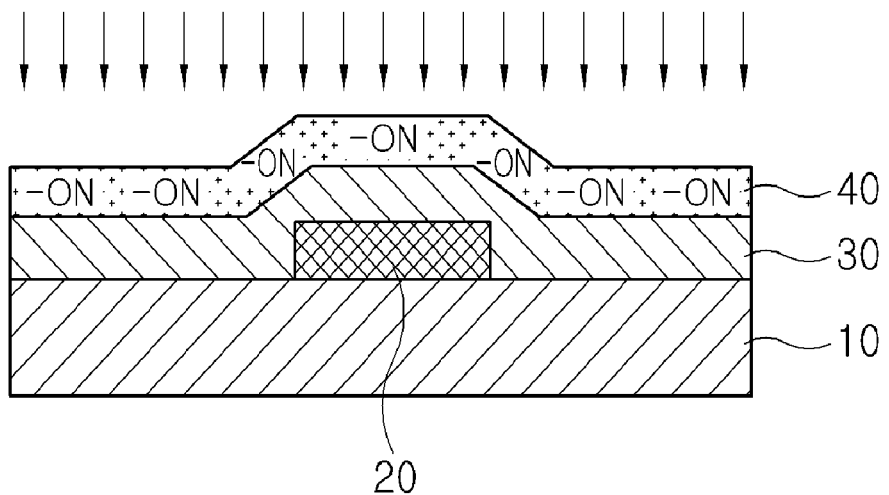

[Fig. 4]
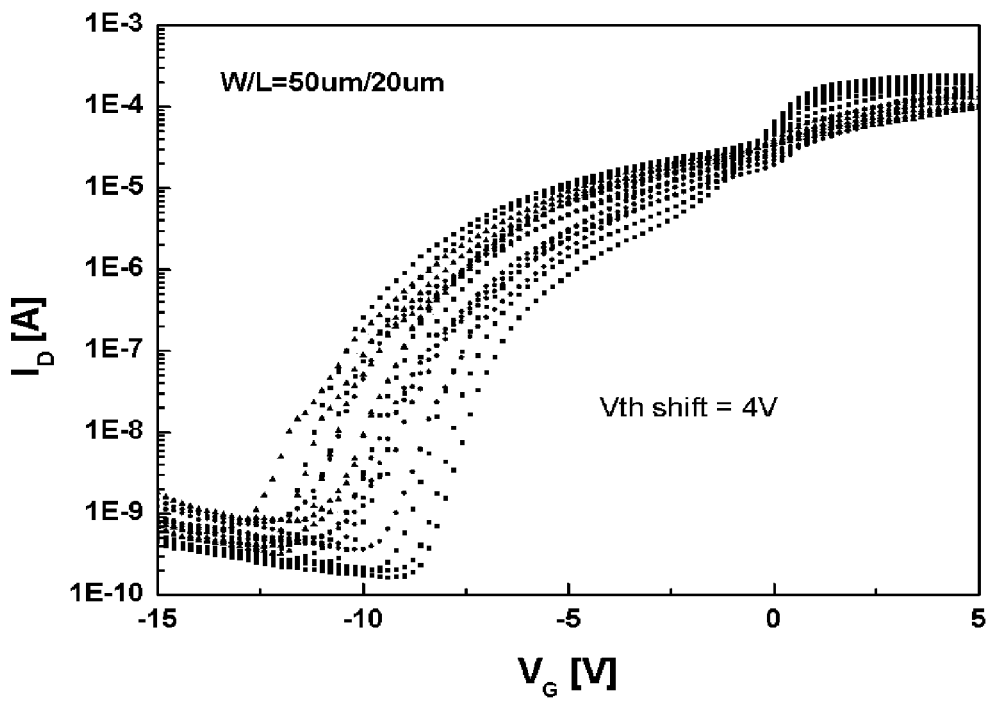
[Fig. 5]
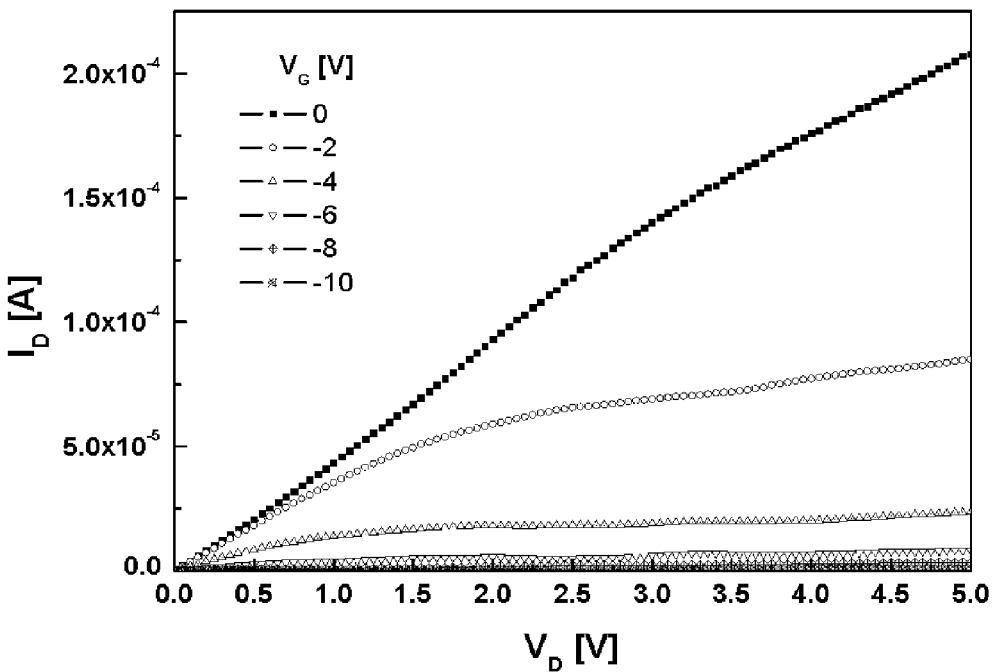

[Fig. 6]
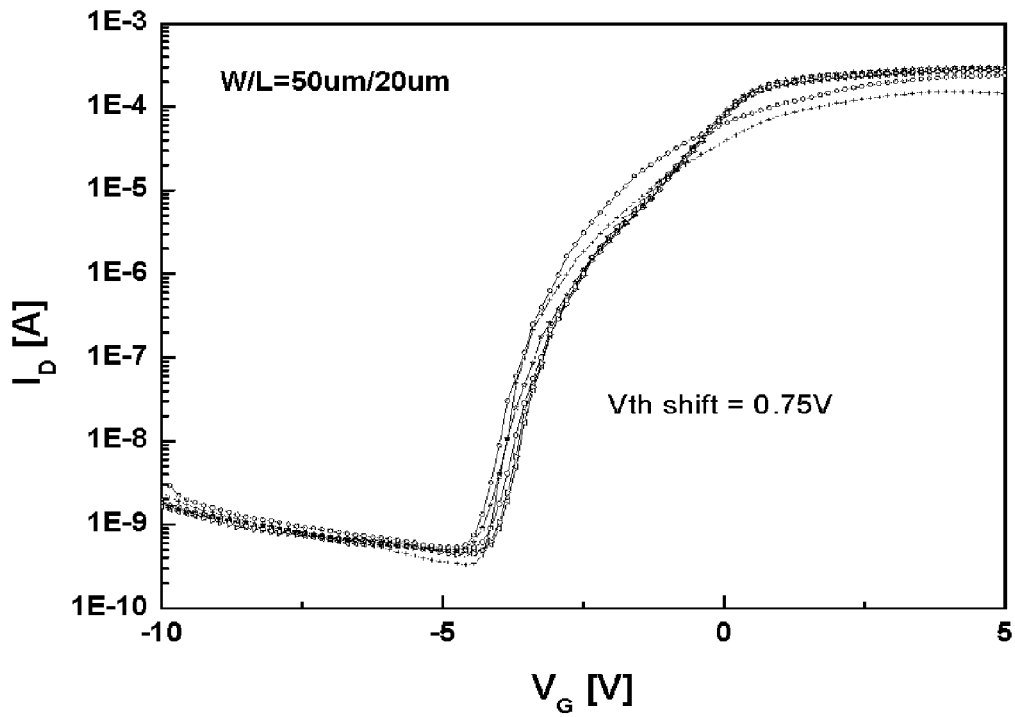
[Fig. 7]
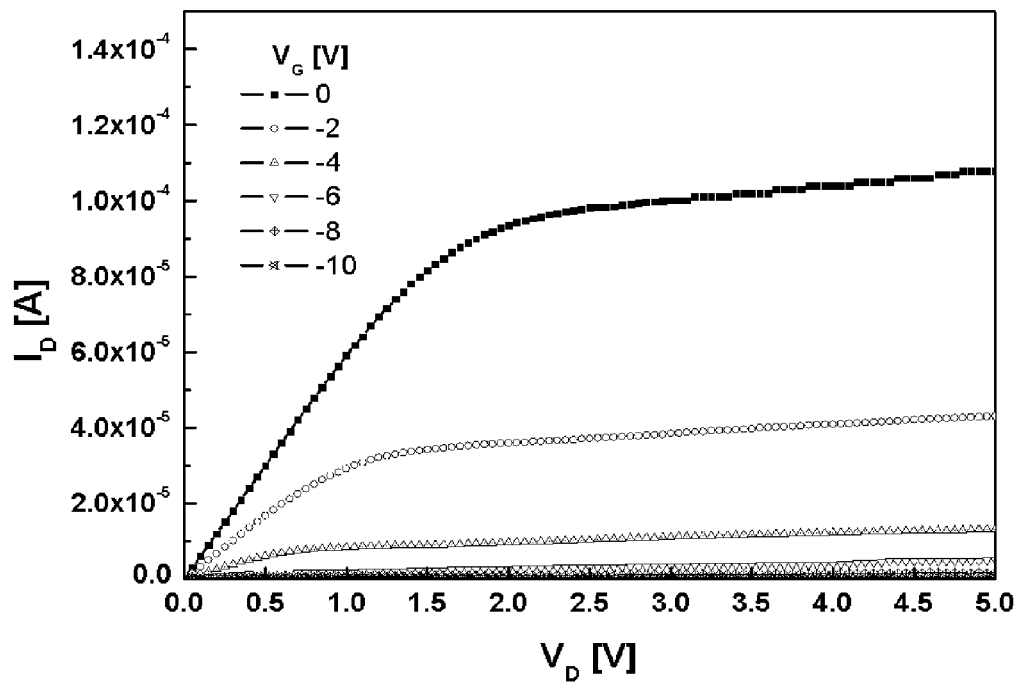

THIN FILM TRANSISTOR AND METHOD FOR PREPARING THE SAME

This application claims the benefit of PCT/KR2008/002376 filed on Apr. 25, 2008, along with Korean Patent Application No. 10-2007-00403328 filed on Apr. 25, 2007, both of which are hereby incorporated herein by reference for all purposes in their entirety.

TECHNICAL FIELD

The present invention relates to a thin film transistor and a method of manufacturing the same. More particularly, the present invention relates to a thin film transistor that includes a zinc oxide material including Si as a channel material of a semiconductor layer, and a method of manufacturing the same.

This application claims priority from Korean Patent Application No. 10-2007-0040328 filed on Apr. 25, 2007 in the Korean Intellectual Property Office, the disclosure of which is incorporated herein by reference in its entirety.

BACKGROUND ART

In general, a thin film transistor includes a source electrode, a drain electrode, a gate electrode, a semiconductor layer, an insulating layer, and a substrate.

In general, ZnO is used as a channel material of the semiconductor layer, and specifically, Group 1 alkali (Li, Na) or Group 5 (N, P, As) is doped in ZnO to be used as a p-type channel material.

However, since ZnO may easily act as a hole killer that is spontaneously generated because a formation enthalpy of an oxygen vacancy, a Zn interstitial and the like capable of being acted as an n-type dopant is very low, it is difficult to perform the p-type doping as the semiconductor layer.

In addition, because an intrinsic characteristic of ZnO in which a formation enthalpy of an oxygen vacancy, a Zn interstitial and the like is low, in the case of when the ZnO thin film transistor is manufactured, there is an unstable state in that a strong n-type channel is formed and a threshold voltage and mobility of the channel are changed according to time.

Meanwhile, Korean Unexamined Patent Application Publication No. 2004-79516 discloses a method of forming a zinc oxide thin film in which a Group 5 element is added as a dopant on a substrate by using a zinc oxide compound including a Group 5 (N, P, As, Sb, Bi) element or oxides of a Group 5 element and activating the dopant. However, the method is disadvantageous in that the activation cannot be easily performed.

Therefore, in the case of when the ZnO thin film transistor is manufactured, since it is difficult to perform the p-type doping by using only the ZnO material, there is a need to develop a material that is capable of being used to perform the p-type doping by using Group 1 alkali (Li, Na and the like) or Group 5 (N, P, As and the like).

DISCLOSURE OF INVENTION

Technical Problem

The present invention has been made keeping in mind the problems occurring in the related art, and an object of the present invention made by the present inventors is to provide a thin film transistor and a method of manufacturing the same, in which n-type conductivity of a channel of a semiconductor layer is reduced and nitrogen doping is easily conducted.

Technical Solution

Specifically, the present invention provides a method of manufacturing a thin film transistor, which includes A) forming a gate electrode on a substrate; B) forming an insulating layer on the substrate and the gate electrode; C) forming a semiconductor layer on the insulating layer by using a zinc oxide material that includes Si as a channel material; and D) forming a source electrode and a drain electrode so as to be connected to the semiconductor layer.

In addition, the present invention provides a method of manufacturing a thin film transistor, which further includes after the forming of the semiconductor layer of step C), 1) performing nitrogen doping treatment on the semiconductor layer by using a plasma nitrification process; and 2) performing oxygen heat treatment to the semiconductor layer that is subjected to the nitrogen doping treatment.

In addition, the present invention provides a thin film transistor that includes a substrate; a gate electrode; an insulating layer; a semiconductor layer; a source electrode; and a drain electrode. The semiconductor layer includes a zinc oxide semiconductor channel material including Si.

Advantageous Effects

In a method of manufacturing a thin film transistor according to the present invention, a method of manufacturing a thin film transistor that includes a zinc oxide material including Si as a channel material of a semiconductor layer and a method of manufacturing a thin film transistor, in which a plasma nitrification process and an oxygen heat treatment process are performed after deposition of the channel material, are used. Accordingly, the n-type conductivity of the channel of the semiconductor layer can be reduced and the nitrogen doping can be performed to the semiconductor layer.

BRIEF DESCRIPTION OF THE DRAWINGS

FIG. 1 is a view that schematically illustrates a section of a thin film transistor according to an embodiment of the present invention;

FIG. 2 is a view that illustrates a plasma nitrification process that is used to manufacture the thin film transistor according to the embodiment of the present invention;

FIG. 3 is a view that illustrates a oxygen heat treatment that is used to manufacture the thin film transistor according to the embodiment of the present invention;

FIG. 4 is a view that illustrates a transfer characteristic of the thin film transistor according to the embodiment of the present invention;

FIG. 5 is a view that illustrates an output characteristic of the thin film transistor according to the embodiment of the present invention;

FIG. 6 is a view that illustrates a transfer characteristic of the thin film transistor according to the embodiment of the present invention; and FIG. 7 is a view that illustrates a output characteristic of the thin film transistor according to the embodiment of the present invention.

REFERENCE NUMERALS

10: substrate
20: gate electrode

30: insulating layer
40: semiconductor layer
50: source electrode
60: drain electrode

BEST MODE FOR CARRYING OUT THE INVENTION

Hereinafter, the present invention will be described in detail.

A method of manufacturing a thin film transistor, which includes A) forming a gate electrode on a substrate; B) forming an insulating layer on the substrate and the gate electrode; C) forming a semiconductor layer on the insulating layer by using a zinc oxide material that includes Si as a channel material; and D) forming a source electrode and a drain electrode so as to be connected to the semiconductor layer.

In the method of manufacturing a thin film transistor according to the present invention, in the forming of the gate electrode on the substrate of step A), the substrate may be made of glass, a semiconductor wafer, metal oxide, ceramic material and plastic that can satisfy thermodynamic and mechanical requirements in respects to the thin film transistor. In particular, the substrate is preferably made of glass or plastic, but the material of the substrate is not limited thereto.

The forming of the gate electrode on the substrate of step A) may be performed by using a process including forming a conductive material layer using the conductive material on the substrate and patterning the conductive material layer to form an electrode pattern. In addition, the forming of the gate electrode on the substrate of step A) may be performed by using a process including directly printing the conductive material on the substrate to perform patterning.

Examples of the conductive material in the forming of the gate electrode on the substrate of step A) may include carbon, aluminium, vanadium, chrome, copper, zinc, silver, gold, magnesium, calcium, sodium, potassium, titanium, indium, yttrium, lithium, gadolinium, tin, lead, similar metals, and an alloy thereof; p- or n-doped silicon; zinc oxide, indium oxide, indium tin oxide (ITO), indium zinc oxide, similar tin oxide and tin oxide indium-based complex compounds; ZnO: a mixture of oxides and metals such as Al, $SnO_2$:Sb; and conductive polymers such as poly(3-methylthiophene), poly[3,4-(ethylene-1,2-dioxy)thiophene], polypyrrole and polyaniline, but are not limited thereto.

In the forming of the gate electrode on the substrate of step A), in the step of forming the conductive material layer, a method that is selected from chemical vapor deposition (CVD), plasma-enhanced chemical vapor deposition (PECVD), sputtering, e-beam evaporation, thermal evaporation, laser molecular beam epitaxy (L-MBE), pulsed laser deposition (PLD), and atomic layer deposition may be used. The method of forming the conductive material layer is not limited thereto, but any method of forming a conductive material layer which is known in the art may be used.

In the forming of the gate electrode on the substrate of step A), in the step of forming the electrode pattern, a process that is selected from a photolithographic process, an offset printing process, a silk screen printing process, an ink-jet printing process, and a process using a shadow mask may be used.

In the forming of the gate electrode on the substrate of step A), the thickness of the gate electrode is in the range of preferably 50 to 400 nm, and more preferably 200 nm.

In the method of manufacturing the thin film transistor according to the present invention, examples of the material of the insulating layer in the forming of the insulating layer of step B) include plastic insulators such as silicon oxide, silicon nitride; polyimide, poly(2-vinylpyrydine), poly(4-vinylphenol), polymethyl methacrylate, but are not limited thereto.

In the forming of the insulating layer of step B), a method that is selected from chemical vapor deposition (CVD), plasma-enhanced chemical vapor deposition (PECVD), sputtering, e-beam evaporation, thermal evaporation, laser molecular beam epitaxy (L-MBE), pulsed laser deposition (PLD), and atomic layer deposition may be used. The method of forming the insulating layer is not limited thereto, but any method of forming an insulating layer which is known in the art may be used.

In the forming of the insulating layer of step B), the thickness of the insulating layer is in the range of preferably 100 to 500 nm and more preferably 300 nm.

In the method of manufacturing the thin film transistor according to the present invention, in the forming of the semiconductor layer of step C), it is preferable that the zinc oxide material including Si used as the channel material be a material including ZnO, ZnO:Al, ZnO:Ga, ZnO:In, or a complex oxide thereof and Si in an amount of more than 0 to 30 mol % or less, but not limited thereto.

In the method of manufacturing the thin film transistor according to the present invention, in the forming of the semiconductor layer of step C), it is more preferable that the zinc oxide material including Si used as the channel material be $ZnO-In_2O_3-SiO_2$.

In $ZnO-In_2O_3-SiO_2$, it is preferable that content of Si is more than 0 to 30 mole % or less, content of Zn is more than 0 to 66 mole % or less, and content of In is more than 0 to 33 mole % or less, but the contents are not limited thereto. In $ZnO-In_2O_3-SiO_2$, in the case of when the content of Si is increased, the conductivity of the semiconductor layer may be significantly reduced to lose a part of the semiconductor layer. In the case of when the content of In is increased, the conductivity may be significantly increased to act as an electrode.

In addition, in $ZnO-In_2O_3-SiO_2$, it is preferable that the mole % ratio of Zn:In:Si be 1:1:1, but not limited thereto.

The zinc oxide material including Si, which is used as the channel material in the forming of the semiconductor layer of step C), may be used alone, or a mixture that includes the zinc oxide material including Si and the Group 1 or 5 material of the periodic table may be used. Preferably, the Group 1 material is Li or Na, and the Group 5 material is N, P, or As, but they are not limited thereto.

It is preferable that the doping concentration of the added Group 1 or 5 material be $10^{15}$ to $10^{20}/cm^3$, but is not limited thereto.

In the forming of the semiconductor layer of step C), the channel material may be deposited to form the semiconductor layer by using sputtering, chemical vapor deposition (CVD), atomic layer deposition, pulsed laser deposition (PLD), laser molecular beam epitaxy (L-MBE), e-beam evaporation, or ion-beam evaporation. Since the channel material includes Si, dopants of Group 5 of the periodic table may be easily doped as compared to the case of when the dopants are directly doped on ZnO. In addition, the counter doping of the semiconductor layer may be easily performed.

In the forming of the semiconductor layer of step C), the thickness of the semiconductor layer is in the range of preferably 10 to 200 nm and more preferably 10 to 100 nm.

The forming of the source electrode and the drain electrode of step D) may be performed by using a process including forming a conductive material layer using the conductive material on the insulating layer and the semiconductor layer and patterning the conductive material layer to form an electrode pattern so that the insulating layer and the semiconductor layer are covered at a time. In addition, the forming of the source electrode and the drain electrode of step D may be performed by using a process including directly printing the conductive material on the insulating layer and the semiconductor layer to perform patterning.

Examples of the conductive material in the forming of the source electrode and the drain electrode of step D) may include carbon, aluminium, vanadium, chrome, copper, zinc, silver, gold, magnesium, calcium, sodium, potassium, titanium, indium, yttrium, lithium, gadolinium, tin, lead, neodymium, platinum, similar metals, and an alloy thereof; p- or n-doped silicon; zinc oxide, indium oxide, indium tin oxide (ITO), indium zinc oxide, similar tin oxide and tin oxide indium-based complex compounds; a mixture of oxides and metals such as ZnO:Al, $SnO_2$:Sb; and conductive polymers such as poly(3-methylthiophene), poly[3,4-(ethylene-1,2-dioxy)thiophene], polypyrrole and polyaniline, but are not limited thereto.

In the forming of the source electrode and the drain electrode of step D), in the step of forming the conductive material layer, a method that is selected from chemical vapor deposition (CVD), plasma-enhanced chemical vapor deposition (PECVD), sputtering, e-beam evaporation, thermal evaporation, laser molecular beam epitaxy (L-MBE), pulsed laser deposition (PLD), and atomic layer deposition may be used. The method of forming the conductive material layer is not limited thereto, but any method of forming a conductive material layer which is known in the art may be used.

In the forming of the source electrode and the drain electrode of step D), in the step of forming the electrode pattern, a process that is selected from a photolithographic process, an offset printing process, a silk screen printing process, an ink-jet printing process, and a process using a shadow mask may be used.

In the forming of the source electrode and the drain electrode of step D), the thickness of the source electrode and the drain electrode is preferably in the range of 50 to 400 nm and more preferably 200 nm.

In the method of manufacturing the thin film transistor according to the present invention, since the zinc oxide material including Si is used as the channel material of the semiconductor layer, the n-type conductivity of the channel of the semiconductor layer may be reduced and the nitrogen doping may be smoothly performed in respects to the semiconductor layer.

In addition, the method of manufacturing a thin film transistor may further includes after the forming of the semiconductor layer of step C), 1) performing nitrogen doping treatment on the semiconductor layer by using a plasma nitrification process; and 2) performing oxygen heat treatment to the semiconductor layer that is subjected to the nitrogen doping treatment.

In the method of manufacturing a thin film transistor according to the present invention, the plasma nitrification process of the nitrogen doping treatment of the step 1) functions to inject N into the semiconductor layer of the thin film transistor, and the oxygen heat treatment of the step 2) functions to more firmly bond N that is injected into the semiconductor layer of the thin film transistor.

In the nitrogen doping treatment of step 1, the plasma nitrification process may use one or more selected from $NH_3$, $N_2O$, $N_2$, NO, and $NF_3$, but is not limited thereto.

The nitrogen doping treatment using the plasma nitrification process may be preferably performed at a temperature in the range of 200 to 500° C. for 60 min or less, but they are not limited thereto.

In a specific embodiment of the nitrogen doping treatment using the plasma nitrification process, the basic process may be performed under the condition of used pressure of 1 mTorr, plasma power of 200 W, a temperature of 300° C., and 3 min. In connection with this, 1050 sccm of $N_2$ and 80 sccm of $NH_3$ may be injected as the used gas. In addition, the doping concentration may be controlled by using plasma power, and it is more preferable to use an ICP (Inductively Coupled Plasma) type of plasma doping.

In the case of when the nitrogen doping treatment is performed, the nitrogen doping concentration is preferably $10^{15}$ to $10^{20}$/cm$^3$, but not limited thereto.

As the oxygen heat treatment of step 2), a rapid thermal annealing (RTA) method under an oxygen atmosphere may be performed. The rapid thermal annealing means a heat treatment method in which a change in temperature applied to a substrate, that is, a temperature ramping rate is high.

As a specific example of the oxygen heat treatment, the rapid thermal annealing may be performed at a temperature in the range of 200 to 500° C. for 1 hour or less under an oxygen atmosphere, but it is not limited thereto.

In respects to the method of manufacturing the thin film transistor according to the present invention, the method of manufacturing the thin film transistor according to the present invention, in which the zinc oxide including Si is used as the channel material of the semiconductor layer and the plasma nitrification process and the oxygen heat treatment process are performed after the deposition of the channel material, is used. Accordingly, oxygen vacancy and spontaneous n-type dopants caused by zinc interstitial, which are problems of the zinc oxide semiconductor, are removed, and N that is a Group 5 p-type dopant is bonded to Si to form the conductivity required as the channel and maintain the conductivity.

In addition, the present invention provides a thin film transistor that includes a substrate; a gate electrode; an insulating layer; a semiconductor layer; a source electrode; and a drain electrode. The semiconductor layer includes a zinc oxide semiconductor channel material including Si.

In the present invention, the semiconductor layer may be sequentially subjected to the plasma nitrification process and the oxygen heat treatment after the formation of the semiconductor layer.

As described in the method of manufacturing the thin film transistor, the zinc oxide material including Si is preferably a material that includes ZnO, ZnO:Al, ZnO:Ga, ZnO:In, or a complex oxide thereof and Si in an amount of more than 0 to 30 mole % or less, but not limited thereto.

In addition, the semiconductor layer may be formed by only using a zinc oxide material including Si or a channel material that includes the zinc oxide material including Si and a Group 1 or 5 material of the periodic table.

MODE FOR THE INVENTION

A better understanding of the present invention may be obtained in light of the following Examples which are set forth to illustrate, but are not to be construed to limit the present invention.

Example

A method of manufacturing a thin film transistor according to an embodiment of the present invention includes 1) forming a gate electrode 20 on a substrate 10; 2) forming an insulating layer 30 on the substrate and the gate electrode 20; 3) forming a semiconductor layer 40 on the insulating layer 30 by using a zinc oxide material including Si as a channel material; 4) performing nitrogen doping treatment on the semiconductor layer 40 by using a plasma nitrification process; 5) performing oxygen heat treatment to the semiconductor layer 40 that is subjected to the nitrogen doping treatment; and 6) forming a source electrode 50 and a drain electrode 60 so as to be connected to the semiconductor layer 40 that is subjected to the oxygen heat treatment.

In step 1), after the indium tin oxide (ITO) film was deposited on the glass substrate 10 by using the sputtering process, the patterning was performed by using the photolithography method to form a plurality of gate wires and gate electrodes 20.

In step 2), the insulating layer 30 was formed on the upper surface of the glass substrate 10 on which the gate electrode wire was formed by using a sputtering method and the gate electrode 20 was formed by using the PECVD method. In connection with this, the gate insulating layer 30 was formed of SiNx.

In step 3), ZnO—$In_2O_3$—$SiO_2$ (mole % ratio Zn:In:Si=1:1:1) was used as the channel material, and the semiconductor layer 40 is formed by using the sputtering method.

In step 4), the semiconductor layer 40 was subjected to the plasma nitrogen doping treatment by using $NH_3$ under the condition of plasma power of 200 W, temperature of 300° C., and pressure of 1 mTorr for 3 min.

In step 5), the semiconductor layer 40 that was subjected to the nitrogen doping treatment was subjected to the rapid oxygen heat treatment (RTO).

In step 6), after the a molybdenum layer was deposited on the upper part of the semiconductor layer 40 and the upper part of the insulating layer 30 by using the sputtering method, the patterning was performed by using the photolithography method to form a data wire that crosses the gate wire and to form a source electrode 50 and a drain electrode 60.

In a method of manufacturing a thin film transistor according to an embodiment of the present invention, ZnO—$In_2O_3$—$SiO_2$ is used as the channel material of the semiconductor layer, and after the deposition of the channel material, the thin film transistor is subjected to the plasma nitrification process and the oxygen heat treatment process. Characteristics of the thin film transistor are shown in FIGS. 6 and 7. In addition, characteristics of the thin film transistor that is not subjected to the plasma nitrification process but the oxygen heat treatment process are shown in FIGS. 4 and 5.

FIG. 4 is a view that illustrates a transfer characteristic of the thin film transistor that is not subjected to the plasma nitrification process but the oxygen heat treatment process, in which the movement of a threshold voltage of 4 V occurs. FIG. 5 is a view that illustrates an output characteristic of the thin film transistor that is not subjected to the plasma nitrification process but the oxygen heat treatment process, in which the output characteristic of the thin film transistor is not saturated but is continuously increased as $V_D$ (drain voltage) is increased.

On the other hand, FIG. 6 is a view that illustrates a transfer characteristic of the thin film transistor that is subjected to the plasma nitrification process and the oxygen heat treatment process according to the present invention, in which the movement of a threshold voltage of 0.75 V occurs. FIG. 7 is a view that illustrates an output characteristic of the thin film transistor that is subjected to the plasma nitrification process and the oxygen heat treatment process according to the present invention, in which the output characteristic of the thin film transistor is saturated and stabilized as $V_D$ (drain voltage) is increased.

In FIGS. 4 to 7, $I_D$ is a drain voltage, $V_G$ is a gate voltage, $V_D$ is a drain voltage, and W/L is a width and a length of the channel.

The invention claimed is:

1. A method of manufacturing a thin film transistor, the method comprising the steps of:
  A) forming a gate electrode on a substrate;
  B) forming an insulating layer on the substrate and the gate electrode;
  C) forming a semiconductor layer on the insulating layer by using a zinc oxide material that comprises Si as a channel material;
  C1) performing a nitrogen doping treatment on the semiconductor layer by using a plasma nitrification process;
  C2) performing an oxygen heat treatment to the semiconductor layer that is subjected to the nitrogen doping treatment; and
  D) forming a source electrode and a drain electrode so as to be connected to the semiconductor layer.

2. The method of manufacturing a thin film transistor according to claim 1, wherein in the forming of the semiconductor layer of step C), the zinc oxide material comprising Si is a material comprising ZnO, ZnO:Al, ZnO:Ga, ZnO:In, or a complex oxide thereof and Si in an amount of more than 0 to 30 mol % or less.

3. The method of manufacturing a thin film transistor according to claim 2, wherein in the forming of the semiconductor layer of step C), the zinc oxide material comprising Si is a material comprising ZnO, ZnO:Al, ZnO:Ga, ZnO:In, or a complex oxide thereof and Si in an amount of more than 0 to 30 mol % or less.

4. The method of manufacturing a thin film transistor according to claim 2, wherein in the forming of the semiconductor layer of step C), the zinc oxide material comprising Si is ZnO—$In_2O_3$—$SiO_2$.

5. The method of manufacturing a thin film transistor according to claim 4, wherein content of Si is more than 0 to 30 mole % or less, content of Zn is more than 0 to 66 mole % or less, and content of In is more than 0 to 33 mole % or less in ZnO—$In_2O_3$—$SiO_2$.

6. The method of manufacturing a thin film transistor according to claim 4, wherein a mole % ratio of Zn:In:Si of ZnO—$In_2O_3$—$SiO_2$ is 1:1:1.

7. The method of manufacturing a thin film transistor according to claim 2, wherein in the forming of the semiconductor layer of step C), the channel material is a zinc oxide material comprising Si used alone or a material containing the zinc oxide material comprising Si and a Group 1 or 5 material of the periodic table.

8. The method of manufacturing a thin film transistor according to claim 1, wherein in the forming of the semiconductor layer of step C), the zinc oxide material comprising Si is ZnO—$In_2O_3$—$SiO_2$.

9. The method of manufacturing a thin film transistor according to claim 8, wherein content of Si is more than 0 to 30 mole % or less, content of Zn is more than 0 to 66 mole % or less, and content of In is more than 0 to 33 mole % or less in ZnO—$In_2O_3$—$SiO_2$.

10. The method of manufacturing a thin film transistor according to claim 8, wherein a mole % ratio of Zn:In:Si of ZnO—$In_2O_3$—$SiO_2$ is 1:1:1.

11. The method of manufacturing a thin film transistor according to claim 1, wherein in the forming of the semiconductor layer of step C), the channel material is a zinc oxide material comprising Si used alone or a material containing the zinc oxide material comprising Si and a Group 1 or 5 material of the periodic table.

12. The method of manufacturing a thin film transistor according to claim 1, wherein the plasma nitrification process of step C1) uses one or more selected from $NH_3$, $N_2O$, $N_2$, NO, and $NF_3$.

13. The method of manufacturing a thin film transistor according to claim 1, wherein the plasma nitrification process of step C1 is performed at a temperature of 200 to 500° C. for 60 min or less.

14. The method of manufacturing a thin film transistor according to claim 1, wherein the plasma nitrification process of step C1 is an ICP (Inductively Coupled Plasma) type of plasma nitrification process.

15. The method of manufacturing a thin film transistor according to claim 1, wherein in step C2, a rapid thermal annealing method is performed under an oxygen atmosphere at a temperature of 200 to 500° C. for 1 hour or less as the oxygen heat treatment.

* * * * *